United States Patent
Song et al.

(10) Patent No.: US 9,859,475 B2
(45) Date of Patent: Jan. 2, 2018

(54) LIGHT EMITTING DIODE PACKAGE INCLUDING COLOR ABSORBING BODY MEMBER

(71) Applicant: Samsung Display Co., Ltd., Yongin-Si, Gyeonggi-Do (KR)

(72) Inventors: Sijoon Song, Suwon-si (KR); Youngchun Kim, Seoul (KR); Hyun-jeong Kim, Hwaseong-si (KR); Seokhyun Nam, Seoul (KR); Changyong Park, Bucheon-si (KR)

(73) Assignee: SAMSUNG DISPLAY CO., LTD., Gyonggi-Do (KR)

( * ) Notice: Subject to any disclaimer, the term of this patent is extended or adjusted under 35 U.S.C. 154(b) by 0 days.

(21) Appl. No.: 14/862,278

(22) Filed: Sep. 23, 2015

(65) Prior Publication Data
US 2016/0284948 A1    Sep. 29, 2016

(30) Foreign Application Priority Data

Mar. 27, 2015 (KR) .................. 10-2015-0043581

(51) Int. Cl.
*H01L 33/50* (2010.01)

(52) U.S. Cl.
CPC .......... *H01L 33/504* (2013.01); *H01L 33/507* (2013.01); *H01L 2224/48091* (2013.01); *H01L 2224/48247* (2013.01); *H01L 2924/181* (2013.01); *H01L 2933/0041* (2013.01)

(58) Field of Classification Search
None
See application file for complete search history.

(56) References Cited

U.S. PATENT DOCUMENTS

| 8,360,593 | B2 | 1/2013 | Kim et al. | |
| 2002/0001192 | A1* | 1/2002 | Suehiro | G02B 6/0068 362/240 |
| 2002/0153835 | A1* | 10/2002 | Fujiwara | H01L 51/5203 313/506 |
| 2006/0071591 | A1* | 4/2006 | Takezawa | B29C 45/0013 313/501 |

(Continued)

FOREIGN PATENT DOCUMENTS

| JP | 2012-007159 A | 1/2012 |
| JP | 2012-144685 A | 8/2012 |

(Continued)

*Primary Examiner* — Bilkis Jahan
(74) *Attorney, Agent, or Firm* — Cantor Colburn LLP

(57) ABSTRACT

A light emitting diode package includes a light emitting diode which emits a first light having a first color; a body member defining a planar part thereof on which the light emitting diode is mounted, and a side part thereof which is extended upward from the planar part, the planar and side parts defining an inner cavity in which the light emitting diode is disposed; and a filling member which fills the inner cavity and includes a base part in which a plurality of first phosphors is dispersed, the plurality of first phosphors absorbing a portion of the first light and generating a second light having a second color different from the first color. The body member which defines the planar and side parts thereof has a third color different color from the second color, and the body member having the third color absorbs light having the second color.

15 Claims, 6 Drawing Sheets

(56) References Cited

U.S. PATENT DOCUMENTS

| | | | | |
|---|---|---|---|---|
| 2006/0097621 | A1* | 5/2006 | Park | H05B 33/10 |
| | | | | 313/485 |
| 2009/0315053 | A1* | 12/2009 | Lee | C09K 11/7734 |
| | | | | 257/98 |
| 2010/0230694 | A1* | 9/2010 | Arndt | H01L 33/44 |
| | | | | 257/98 |
| 2014/0117388 | A1* | 5/2014 | Kuo | H01L 33/54 |
| | | | | 257/98 |
| 2015/0263243 | A1* | 9/2015 | Nakagawa | H01L 33/504 |
| | | | | 257/98 |
| 2015/0329770 | A1* | 11/2015 | Kaneyoshi | B05D 1/18 |
| | | | | 252/301.36 |

FOREIGN PATENT DOCUMENTS

| | | |
|---|---|---|
| JP | 2012-186274 A | 9/2012 |
| KR | 1020120049699 A | 5/2012 |
| KR | 1020130045746 A | 5/2013 |

\* cited by examiner

LIGHT EMITTING DIODE PACKAGE INCLUDING COLOR ABSORBING BODY MEMBER

This application claims priority to Korean Patent Application No. 10-2015-0043581 filed Mar. 27, 2015, and all the benefits accruing therefrom under 35 U.S.C. §119, the entire contents of which are hereby incorporated by reference.

BACKGROUND (1) Field

The invention described herein relates to a light emitting diode package, and more particularly, relates to a light emitting diode package which lessens an afterglow effect therefrom.

(2) Description of the Related Art

Light emitting devices, for example, light emitting diodes, are semiconductor devices which convert electric energy into light. Such light emitting devices have generated interest as a next generation light source to replace traditional fluorescent lamps or incandescent lamps.

Light emitting diodes use a semiconductor material to generate light, thus consuming less power as compared to incandescent lamps which heat tungsten to generate light or fluorescent lamps which collides ultra violet rays to cause a phosphor to glow thus generating light through high voltage discharge.

Additionally, light emitting diodes use potential gaps of semiconductors to generate light, which is more advantageous to lifetime, response characteristics and eco-familiarity as compared to other general light sources such as the fluorescent lamps or incandescent lamps.

On the merits thereof, along with many studies to replace traditional light sources with light emitting diodes, the light emitting diodes are increasingly used as light sources of lightening apparatuses such as diverse lamps, liquid crystal display devices, electric light panels, road lamps, and so on.

SUMMARY

One or more exemplary embodiments of the invention provide a light emitting diode package which lessens an afterglow effect of specific-colored light emitted therefrom.

In an exemplary embodiment, a light emitting diode package includes a light emitting diode which generates and emits a first light having a first color; a body member defining a planar part thereof on which the light emitting diode is mounted, and a side part thereof which is extended upward from the planar part, the planar part and the side part defining an inner cavity of the light emitting diode package in which the light emitting diode is disposed; and a filling member which fills the inner cavity defined by the planar part and the side part, the filling member including a base part in which is dispersed a plurality of first phosphors, where the plurality of first phosphors which is dispersed in the base part absorbs a first portion of the first light emitting by the light emitting diode and generates a second light having a second color different from the first color. The body member which defines the planar and side parts thereof has a third color from the second color, and the body member which has the third color absorbs light having the second color.

The third color may be one of blue, cyan and black.

The second color may be red and the first colored light may be blue.

The first phosphors may include a fluorinated material.

The filling member may further include a plurality of second phosphors dispersed in the base part in which the plurality of first phosphors is dispersed. The plurality of second phosphors which is dispersed in the base part absorbs a second portion of the first light and generates a third light having a fourth color different from the first color and the second color.

The fourth color may be green.

The body member which absorbs light having the second color may include a matrix material part, and a plurality of pigment particles dispersed in the matrix material part and having the third color.

The matrix material part may include a resinous material or silicon.

Pigment particles content in body member may increase as close to the inner cavity.

The base part of the filling member may be a resinous material or silicon.

The light emitting diode package may further include a first lead fixed to the body member and through which a first voltage is provided to the light emitting diode which is mounted on the planar part of the body member, and a second lead which is fixed to the body member to be insulated from the first lead and through which a second voltage lower than the first voltage is provided to the light emitting diode to which the first voltage is provided.

As describe above, one or more exemplary embodiments of a light emitting diode package may include a light emitting diode generating a first light having a first color, a first phosphor excited by the first light to generate a second light having a second color, and a body member having a third color different color from the second color. The body member having the third color may absorb and extinguish a portion of the second light having the second color.

Accordingly, since the light emitting diode package may extinguish the second colored light that is not emitted therefrom but remains therein, controlling drivability of the light emitting diode package is made easier. Additionally, since the light emitting diode package may extinguish the second colored light that is not emitted therefrom but remains therein, the light emitting diode package controls afterglow characteristics by simply changing a color of the body member to the third color which is overlaid with the second color of the second light within a light wavelength range.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
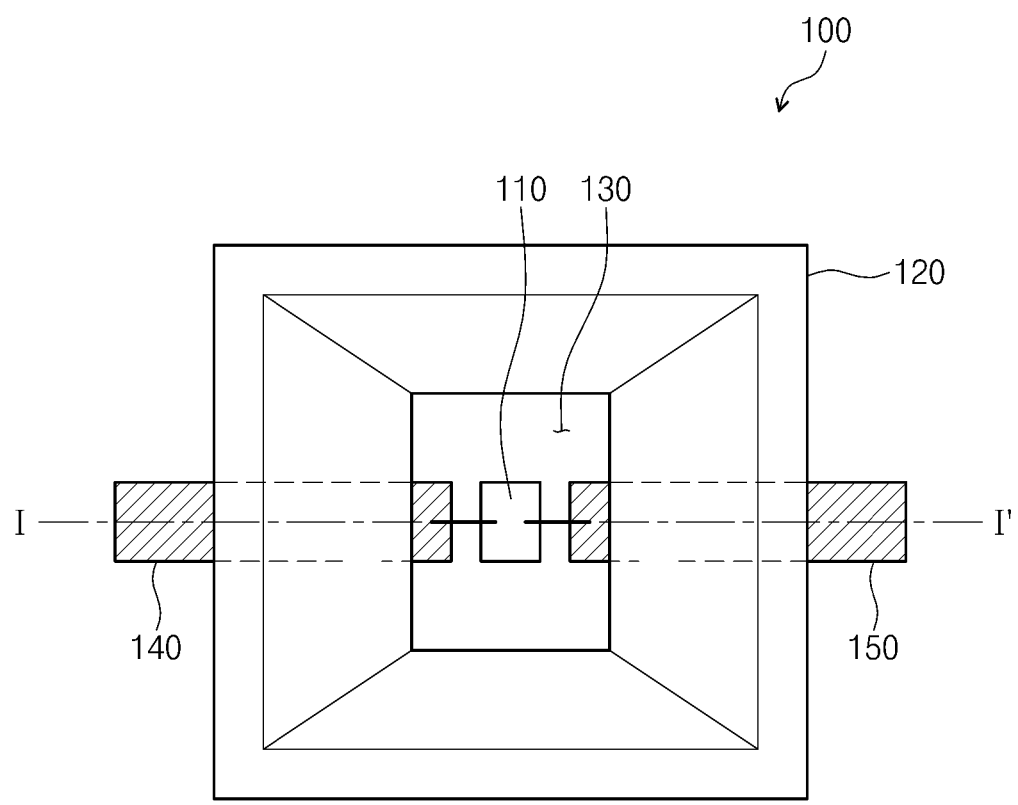
FIG. 1 is a plan view illustrating an exemplary embodiment of a light emitting diode package according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter will be described exemplary embodiments of the invention in conjunction with accompanying drawings.

Figure 2:
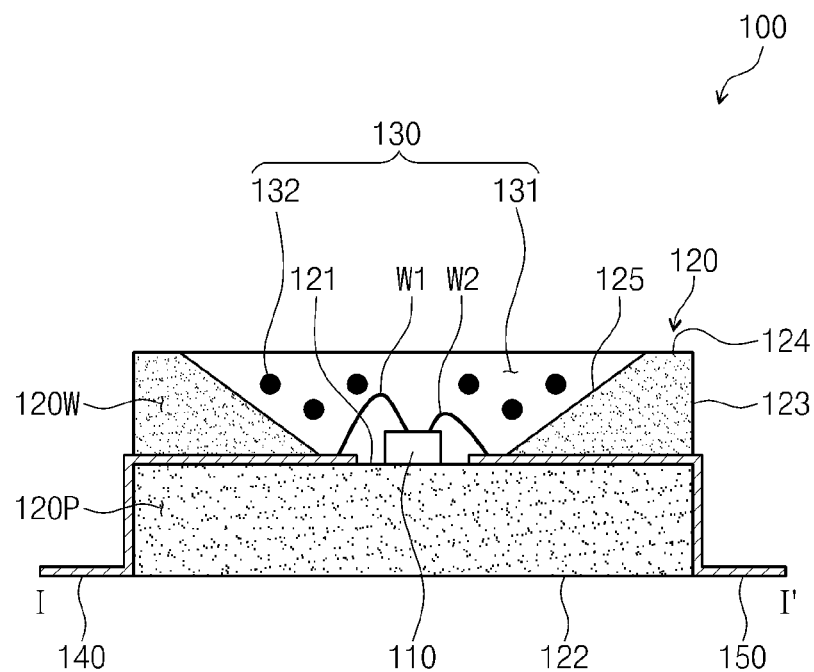
FIG. 2 is a sectional view taken along IT of FIG. 1.
Figure 3:
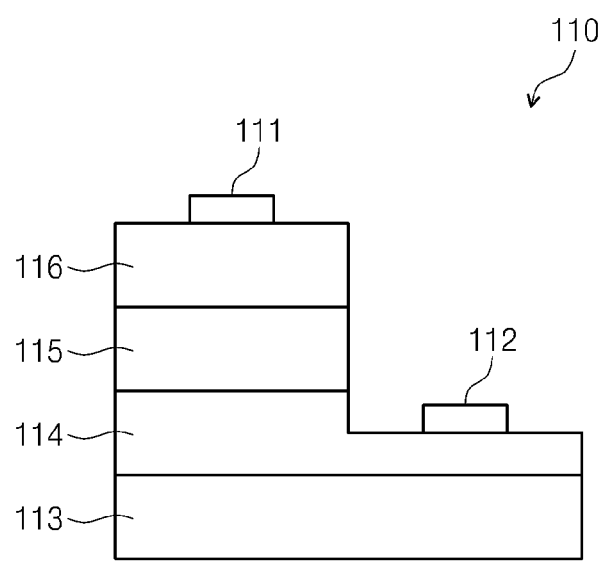
FIG. 3 is a sectional view illustrating an exemplary embodiment of a light emitting diode included in FIG. 1.

FIG. 1 is a plan view illustrating an exemplary embodiment of a light emitting diode package according to the invention. FIG. 2 is a sectional view taken along I-I' of FIG. 1. FIG. 3 is a sectional view illustrating an exemplary embodiment of a light emitting diode included in FIG. 1.

The light emitting diode package 100 may include a light emitting diode 110, a body member 120, a filling member 130 and a pair of leads 140 and 150.

The light emitting diode package 110 may generate light in response to a drive voltage which is applied thereto through first and second electrodes thereof. The light emitting diode 110 may be structured in a stack of an N-type semiconductor layer, an active layer, and a P-type semiconductor layer in sequence. In the structure, if a drive voltage is applied thereto, electrons and holes are re-coupled to generate light.

The light emitting diode 110 will be further described in conjunction with FIG. 3. FIG. 3 shows an exemplary embodiment of a light emitting diode which is employable in a light emitting diode package.

As shown in FIG. 3, the light emitting diode 110 may include an N-type semiconductor layer 114, an active layer 115 and a P-type semiconductor layer 116, all of which are sequentially stacked on a substrate 113. Additionally, the light emitting diode 110 may include a P-type electrode (hereinafter, referred to as "a first electrode") 111 which is connected with the P-type semiconductor layer 116, and an N-type electrode (hereinafter, referred to as "a second electrode") 112 which is connected with the N-type semiconductor layer 114.

The substrate 113 may include or be formed of a transparent material containing sapphire ($Al_2O_3$), but the invention is not limited thereto. The substrate 113 may include or be formed of sapphire, zinc oxide (ZnO), gallium nitride (GaN), silicon carbide (SiC) or aluminum nitride (AlN).

The N-type semiconductor layer 114 may include or be formed of an N-type nitride semiconductor layer such as GaN or GaN/AlGaN into which N-type conductive impurities are doped. In an exemplary embodiment, for example, the N-type semiconductor layer 114 may include or be formed of indium aluminum gallium nitride (InAlGaN), gallium nitride (GaN), aluminum gallium nitride (AlGaN), indium gallium nitride (InGaN), aluminum nitride (AlN), indium nitride (InN) or aluminum indium nitride (AlInN), into one of which silicon (Si), germanium (Ge), tin (Sn), or carbon (C) is doped.

The P-type semiconductor layer 116 may include or be formed of a P-type nitride semiconductor layer into which P-type conductive impurities are doped. In an exemplary embodiment, for example, the P-type semiconductor layer 116 may include or be formed of indium aluminum gallium nitride (InAlGaN), gallium nitride (GaN), aluminum gallium nitride (AlGaN), indium gallium nitride (InGaN), aluminum nitride (AlN), indium nitride (InN) or aluminum indium nitride (AlInN), into one of which magnesium (Mg), zinc (Zn), calcium (Ca), strontium (Sr), or barium (Ba) is doped.

The active layer 115 may be disposed between the N-type semiconductor layer 114 and the P-type semiconductor layer 116. Electrons injected from the N-type semiconductor layer 114, may be coupled with holes which are injected from the P-type semiconductor layer 116, in the active layer 115.

The active layer 115 may generate light in correspondence with an energy band gap difference thereof. A band gap difference of the active layer 115 may change a wavelength of light which is generated from the light emitting diode 110.

The light emitting diode 110 may generate a first light having a first color. The first color may be variable in color according to a band gap difference of the light emitting diode 110. In an exemplary embodiment, for example, the first color may be a blue color which is ranged in a wavelength larger than about 450 nanometers (nm), such as about 500 nm.

The active layer 115 may have one of a single quantum well structure, a multiple quantum well structure, a quantum dot structure and a quantum wire structure. Additionally, the active layer 115 may have a structure where pluralities of quantum well layers and quantum barrier layers are alternately stacked, but the invention is not limited thereto.

The light emitting diode 110 may emit light outward through the top and side thereof. Although not shown, the light emitting diode 110 may further include a pattern which is defined in and/or on the top and side thereof. The pattern may act to improve optical extraction efficiency of the light emitting diode 110.

Returning to FIGS. 1 and 2, the body member 120 may define a contour of the light emitting diode 100. The body member 120 may fix the light emitting diode 110, the first lead 140 and the second lead 150 within the light emitting diode package 100.

The body member 120 may define a planar part 120P and a sidewall part 120W thereof. The planar part 120P may define a mounting surface 121, a rear surface 122 and a portion of a side surface 123 of the body member 120.

The mounting surface 121 may be extended to be parallel with the rear surface 122. The light emitting diode 110 may be disposed on the mounting surface 121. In an exemplary embodiment, the light emitting diode 110 may be mounted on the mounting surface 121 through a resinous adhesion sheet (not shown) or a conductive adhesion sheet (not shown).

The planar part 120P may have various forms to have an overall planar shape in the plan view. The body member 120 may be shaped in a polygon, a circle or an ellipse on a plane in the plan view, but the invention is not limited thereto. In this specification, the body member 120 will be exemplified with a tetragon in the plan view.

The sidewall part 120W may be connected with the planar part 120P such as to be folded upward from the planar part 120P. The sidewall part 120W may be disposed on the planar part 120P to expose a portion of the planar part 120P. The exposed portion of the planar part 120P may define the mounting surface 121. The sidewall part 120W may define a top surface 124 of the body member 120, another portion of the side surface 123 of the body member 120, and an inner surface 125 of the body member 120.

The top surface 124 may link the side surface 123 with the inner surface 125. In the cross-sectional view, the top surface 124 may be extended in a plane parallel with the rear surface 122, but the invention is not limited thereto. In an exemplary embodiment, the top surface 124 may be shaped in a curve in the cross-sectional view. The curve of the top surface 124 may include a convex or concave. While the top surface 124 is illustrated to link the side surface 123 with the inner surface 125, the invention is not limited thereto. In an exemplary embodiment of the invention, the top surface 124 may be omitted such that the inner surface 125 is directly linked with the side surface 123.

The inner surface 125 may define a slope which is slanted or inclined from the mounting surface 121 at an angle less than about 90° with respect to the mounting surface 121. A sloping degree of the inner surface 125 may affect an angle of light beams spread from the light emitting diode package 100.

The planar part 120P and the sidewall part 120W may define an inner cavity. In this configuration, the rear surface 122 and the side surface 123 may define an outer surface of the body member 120. Additionally, the inner surface 125 and the mounting surface 121 may define an inner surface of the body member 120.

The inner cavity may be open at an upper part thereof. The inner cavity may be defined by portions of the sidewall part 120W. The inner cavity may be shaped in recess, cup or tube to have a curvature, but the invention is not limited thereto. The shape of the inner cavity may be taken from the top surface 124 or from an uppermost surface of the sidewall part 120W. Otherwise, without being restricted to a specific pattern, the inner cavity may be shaped in various forms.

The filling member 130 may fill the inner cavity. The filling member 130 may be settled to surround and protect the light emitting diode 110. The filling member 130 may include a base material or part 131 and a plurality of first phosphors 132.

The base part 131 may include or be made of a transparent insulation material. In an exemplary embodiment, for example, the base part 131 may contain silicon (Si), or a resinous material such as epoxy.

The plurality of first phosphors 132 may be dispersed in the base part 131. The first phosphors 132 may absorb at least a portion of the first light, and then generate a second light having a second color which is different from the first light. In detail, the plural phosphors 132 may absorb a portion of the first light to transition into an exited state thereof, and then return to a relatively stable state thereof to emit the second light.

As the second light is different from the first light in wavelength, the second light may be different from the first light in color. Generally, the second light is longer than the first light in terms of wavelength of light.

The first phosphors 132 may include or be formed of yttrium aluminum oxide garnet (YAG), terbium aluminum garnet (TAG), silicate, nitride-based materials, or oxy-nitride-based materials. The phosphors may include at least one of red phosphors, green phosphors and yellow phosphors.

In the exemplary embodiment, the first phosphors 132 may be red phosphors. The red phosphors may be excited by a portion of the first light to generate the second light in the wavelength range of about 620 nm to 780 nm. Thus, the second color may be red. The filling portion 130 may include only a single color phosphor as the first phosphors 132, such as the red phosphors described above, but the invention is not limited thereto.

Additionally, the first phosphors 132 may be fluoride-based phosphors. That is, the first phosphors 132 may include a fluorinated material. As used herein, "fluorinated" means a compound containing at least one fluorine atom. In an exemplary embodiment, for example, the red phosphors may be formed of $K_2SiF_6:Mn^{4+}$. The light emitting diode package 100 according to one or more exemplary embodiments of the invention may include fluoride-based phosphors to generate red-colored light in the wavelength band of which a half width thereof is lower than or equal to about 30 nm.

The body member 120 may absorb the second light which is emitted from the first phosphors 132. Accordingly, a portion of the second light which is emitted toward the body member 120, may not be visibly recognized as being absorbed into the body member 120.

The body member 120 may include or have the third light having the third color. The third color of body member 120 may be overlaid with the second light within a light wavelength range. In an exemplary embodiment, for example, the third color may be black, blue or cyan.

The body member 120 may have the third color in various ways. In an exemplary embodiment, the body member 120 may have the third color by including or being formed of a base part of a matrix material and a plurality of pigment particles. The planar part 120P and/or the sidewall part 120W may include the base part of the matrix material and the plurality of pigment particles.

The matrix material part may include or be formed of an insulation material or a conductive material. In an exemplary embodiment, for example, the matrix material part may contain a resinous material such as polyphthalamide ("PPA"), silicon carbide, silicon, aluminum nitride, a metal, a photosensitive glass or sapphire ($Al_2O_3$).

The pigment particles may have or be the third color to impart the third color to the body member 120. The pigment particles may be dispersed in the matrix material part of the body member 120. The pigment particles may be uniformly dispersed over an entirety of the body member 120. Accordingly, the body member 120 according to an exemplary embodiment of the invention may have the third color.

In an exemplary embodiment, the body member 120 according to the invention may be formed through an injection molding process after combining the pigment particles with a matrix material. By using the pigment particles, the body member 120 which absorbs the second light may be formed through a relatively simple process.

In the drawings, the body member 120 is embodied as having the third color at substantially an entirety thereof, but the invention is not limited thereto. In FIG. 2, for example, shading of the body member 120 is indicated at substantially an entirety thereof. In an exemplary embodiment of the invention, the third color may be partially defined within the body member 120.

The third color may be partially defined within the body member 120 by a varied content or dispersion of the pigment particles within the body member 120. A content of the pigment particles within the body member 120 may increase in a direction closer to the inner cavity from locations in the body member 120 further from the inner cavity. In an exemplary embodiment, for example, a larger content of the third color of the body member 120 may disposed at the mounting surface 121 which is closest to the inner cavity, and adjacent to the inner surface 125, as compared to other portions of the body member 120 further from the inner cavity.

As the second light is incident on the body member 120 through the mounting surface 121 and the inner surface 125 of the body member 120, portions of the body member 120 which are adjacent to the mounting surface 121 and the inner surface 125 and have the third color, may absorb the second light incident thereto.

To form the body member 120 partly having the third color, surfaces of portions of the body member 120 which are adjacent to the mounting surface 121 and the inner surface, may be colored such as by being coated or painted with a third color material. To form the body member 120 partly having the third color, portions of the body member 120 which are adjacent to the mounting surface 121 and the inner surface may be colored such as by concentrating the pigment particles within the matrix material part only at these portions which are adjacent to the mounting surface 121 and the inner surface 125. The body member 120 may be partly colored by shaping and structuring the body member 120 in various ways, without being restricted to any of the above-described exemplary embodiments.

Although not shown, the light emitting diode package 100 may further include a cover member. The cover member may cover the inner cavity. The cover member may seal the filling member 130 within the inner cavity.

The cover member may be shaped in various patterns. For example, the cover member may have a plate shape which is extended to be parallel with the mounting surface 121. Otherwise, the cover member may have a spherical shape to improve optical diffusion characteristics of the light emitting diode package 100. The shape of the cover member is not restricted to any of the above-described exemplary embodiments.

The first lead 140 may be connected with the first electrode 111 of the light emitting diode 110 and the second lead 150 may be connected with the second electrode 112 of the light emitting diode 110. An external drive voltage may be supplied to the light emitting diode 110 through the first lead 111. A drive voltage, which is reduced in voltage level, may be drawn out of the light emitting diode package 100 through the second lead 150.

The light emitting diode 110 may be supplied with a first voltage through the first lead 140 and supplied with a second voltage, which is lower than the first voltage in voltage level, through the second lead 150. A voltage gap between the first voltage and the second voltage may be substantially identical to a voltage level of the drive voltage which is lowered.

The first lead 140 and the second lead 150 may be extended to respectively penetrate parts of the body member 120. In this configuration, first ends of the first lead 140 and the second lead 150 may be respectively disposed on the mounting surface 121, and second ends which are opposite to the first ends thereof, may be protruded from the side surface 123 of the body member 120 to be exposed outside the body member 120.

In this configuration, the first electrode 111 may be connected with the first end of the first lead 140, which is disposed on the mounting surface 121, through a first wire W1. The second electrode 112 may be connected with the first end of the second lead 150 through a second wire W2. The invention is not limited to the aforementioned connecting manner that is simply shown as an example, and other connection manners in which the leads 140 and 150 are respectively connected with the electrodes 111 and 112 are included in the invention, such as by modifying the structure of the light emitting diode 110 shown in FIG. 3. In an exemplary embodiment of connecting the leads 140 and 150 with the electrodes 111 and 112, wires W1 and W2 may be omitted Although not shown, the light emitting diode package 100 may further include a heat sink. The heat sink may be fixed to the body member 120. The heat sink may be extended to penetrate the planar part 120P of the body member 120. The heat sink may contact the light emitting diode 110 to dissipate heat generated by the light emitting diode 110, to reduce or effectively prevent degradation of the light emitting diode 110.

Figure 4A:
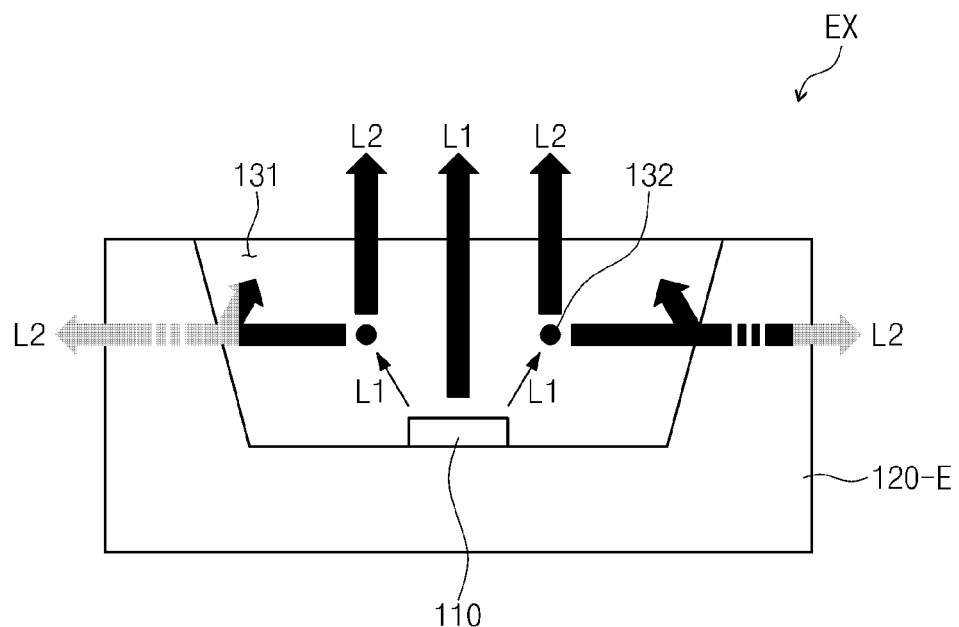
FIG. 4A is a sectional view illustrating light paths in a comparative embodiment of a light emitting diode package.
Figure 4B:
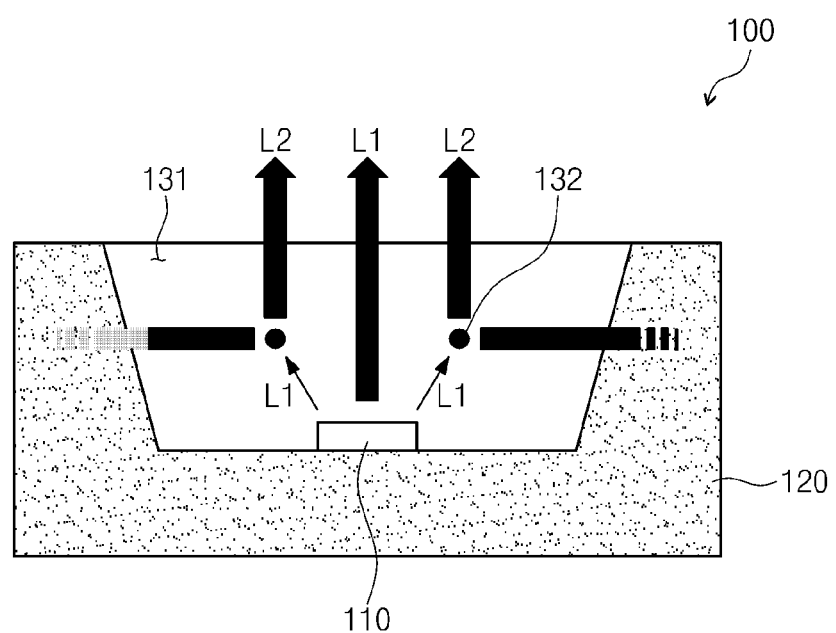
FIG. 4B is a sectional view illustrating light paths in an exemplary embodiment of a light emitting diode package according to the invention.
Figure 5A:
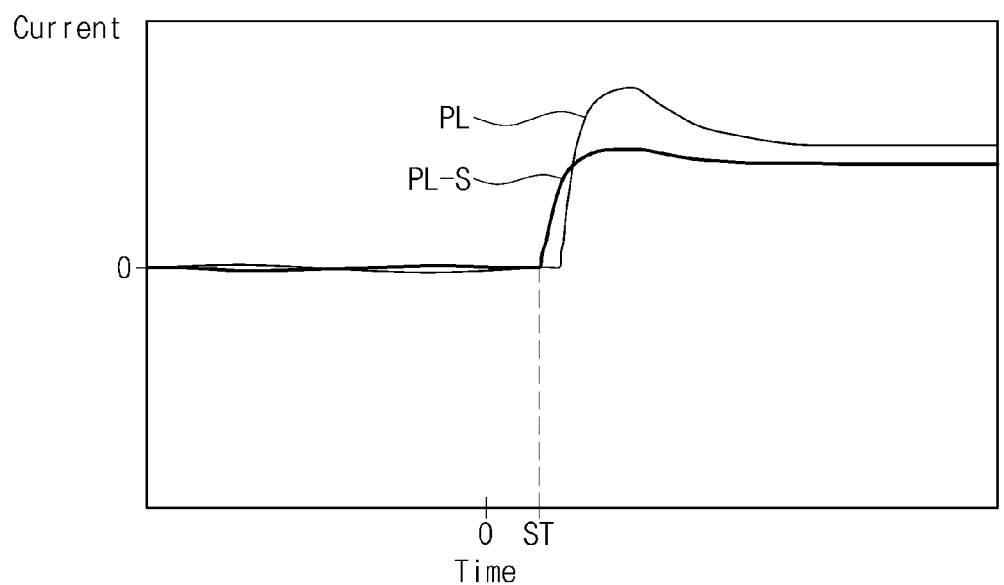
FIGS. 5A and 5B are graphs showing afterglow effects of comparative embodiments of light emitting diodes.
Figure 5B:
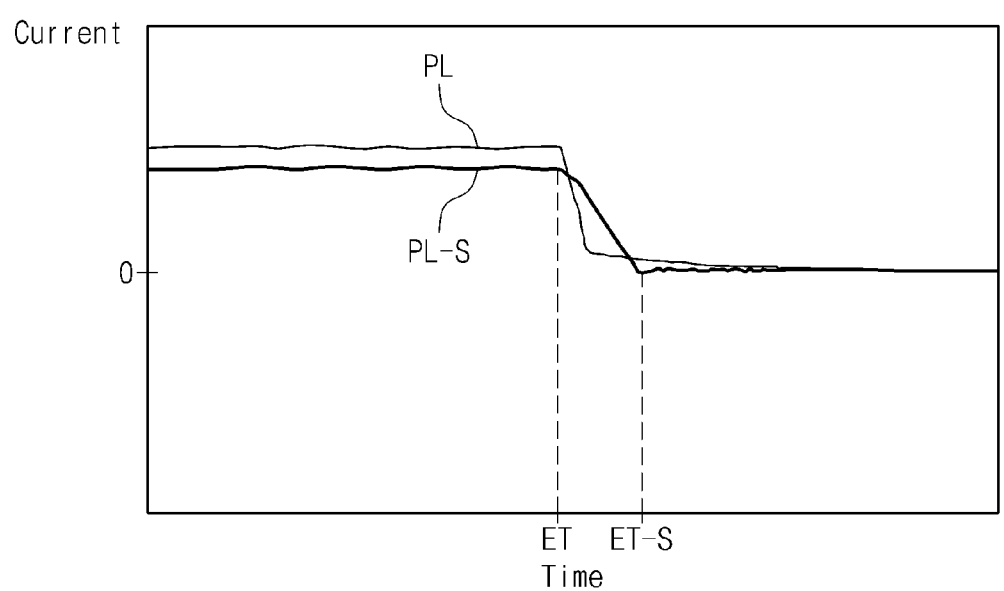

FIG. 4A is a sectional view illustrating light paths in a comparative embodiment of a light emitting diode package. FIG. 4B is a sectional view illustrating light paths in an exemplary embodiment of a light emitting diode package according to the invention. FIGS. 5A and 5B are graphs showing afterglow effects of comparative embodiments of light emitting diodes.

In FIGS. 4A and 4B, some elements are not illustrated for convenience of description. The same elements shown in FIGS. 1 to 3 will be referred to the same reference numerals without duplicative description hereinafter.

A portion of the first light L1 generated from the light emitting diode 110 may be radiated upward within and from the light emitting diode package 100. Another part of the first light L1 generated from the light emitting diode 110 may excite the phosphors 132 such that the excited phosphors 132 generate the second light L2. The second light L2 may be emitted upward within and from the light emitting diode package and thereby visibly recognized from a position external to the light emitting diode package.

As described above, the first phosphors 132 according to one or more exemplary embodiments of the invention may include or be formed of fluoride-based materials. In view of the same red-based light, the second light L2 generated from the first phosphors 132 made of fluoride-based materials may have a narrower half width than light which is generated from phosphors made of nitride-based materials. Accordingly, the light emitting diode package in which the first phosphors 132 include or are formed of fluoride-based materials may have improved color reproducibility.

On the other hand, the second light L2 generated from the first phosphors 132 made of fluoride-based materials may be higher in afterglow effects than light which is generated from phosphors made of nitride-based materials. This will be further described in conjunction with FIGS. 5A and 5B.

FIG. 5A shows voltage/current ('Current') variations with respect to time ('Time') when a light emitting diode package is turned on and FIG. 5B shows voltage/current ('Current') variations with respect to time ('Time') when a light emitting diode package is turned off.

A first graphic plot PL-S shows a variation of an external voltage which is applied to the light emitting diode package and a second graphic plot PL shows a variation of a voltage appearing as the second light. The second graphic plot PL shows whether the second light exists.

As shown in FIG. 5A, if external power is applied at a first time ST along the first graphic plot PL-S, after the first light L1 is generated to excite the phosphors 132, the second light L2 may be generated as indicated by the second graphic plot PL. Intensity of the second light L2 may gradually increase as indicated by the second graphic plot PL rising after the first time ST. During this, since the second light L2 is generated after the first light L1 generated by the external power excites the first phosphors 132, the second graphic plot PL may rise later than the first graphic plot PL-S.

Then, as shown in FIG. 5B, if the external power is turned off at a second time ET (which is after the first time ST) as indicated by the falling first graphic plot PL-S, the second light L2 may be extinguished. Intensity of the second light L2 may be gradually reduced as indicated by the falling second graphic plot PL.

Where the intensity of the second light L2 is reduced starting at the second time ET, at a third time ET-S when the external power is completely shut down (reaches zero (0) 'Current'), there may be afterglow effects generated by the second light L2. That is, the second light L2 may still be present even after the third time ET-S when the external power is completely shut down. The afterglow effects may be generated based on the lifetime of the second light L2 which is generated by the first phosphors 132 excited by the first light L1. The second light L2 may even generate afterglow characteristics remaining for a time even after energy to the first phosphors 132 is removed therefrom.

As described above, the first phosphors 132 of the comparative embodiments discussed with reference to FIGS. 5A and 5B may have higher after glow effects than fluoride-based or nitride-based phosphors. Accordingly, as illustrated in FIGS. 5A and 5B, the second light L2 can be visibly recognized at a location external to the light emitting diode package even after the external power thereto is turned off. The second light L2 being visibly recognized at a location external to the light emitting diode package may affect the drivability of a light source within a light emitting diode package.

As shown in FIG. 4A, the comparative the light emitting diode package EX (hereinafter, referred to as "comparative model") may include a body member 120-E which does not include the third color. Since the body member 120-E does not include or have the third color, the body member 120-E may not absorb the second light L2.

Therefore, where the body member 120-E of the comparative model does not absorb the second light L2, the second light L2 may leak out of the body member 120-E (shown by horizontal arrows L2) or may be reflected from the body member 120-E (shown by inclined arrows L2), after be incident to or penetrating the body member 120-E to remain in the inner cavity of the light emitting diode package EX. The second light L2 leaked out of the body member 120-E or reflected from the body member 120-E causes an afterglow affect. Due to the afterglow effect, the second light L2 may be seen as reddish even after the external power is turned off to the light emitting diode package EX.

Differently, as shown in FIG. 4B, one or more exemplary embodiments of the light emitting diode package 100 according to the invention may include the body member 120 including or having the third color. The third color may be overlaid with the second color of the second light within a light wavelength range.

The body member 120 including or having the third color may absorb and then extinguish a portion of the second light L2 which is not emitted upward from the light emitting diode package 100. Among the second light L2 which is not emitted upward from the light emitting diode package 100, a portion thereof which is not emitted toward the body member 120, may penetrate the body member 120 and may not be visibly recognized at a location external to the light emitting diode package 100. Among the second light L2 which is not emitted upward from the light emitting diode package 100, a remaining portion thereof may be absorbed into the body member 120 to lessen the afterglow effect of the second light L2.

Figure 6A:
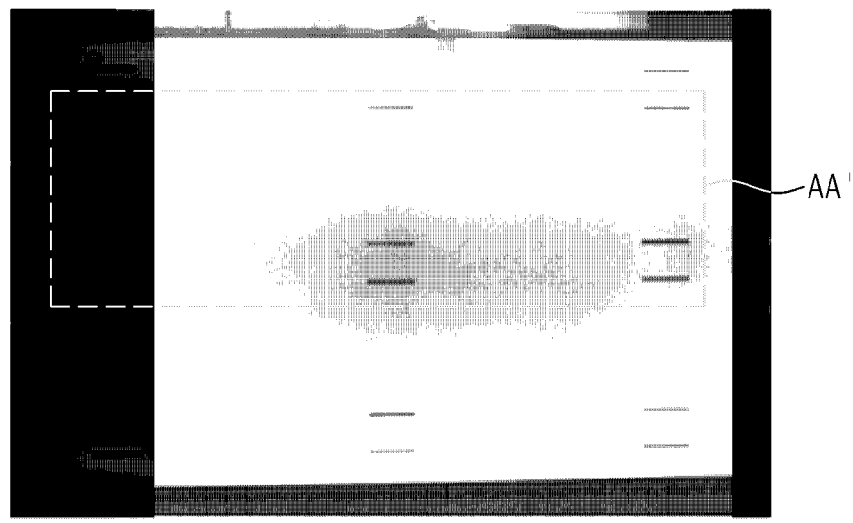
FIG. 6A is a photograph showing the optical characteristics of a light source module which adopts the comparative embodiment of the light emitting diode package in FIG. 4A as a light source.
Figure 6B:
FIG. 6B is a photograph showing the optical characteristics of a light source module which adopts the exemplary embodiment of the light emitting diode package in FIG. 4B as a light source.

FIG. 6A is a photograph showing optical characteristics of a light source module which adopts the comparative model of the light emitting diode package EX in FIG. 4A as a light source. FIG. 6B is a photograph showing optical characteristics of a light source module which adopts the exemplary embodiment of the light emitting diode package 100 in FIG. 4B as a light source.

An exemplary embodiment of a light source module according to the invention may include a plurality of light emitting diode packages and a diffusion plate. FIGS. 6A and 6B shows relative variations of optical colors which are visible recognized through the diffusion plate under which is uniformly arranged the plural light emitting diode packages such that the diffusion plate is disposed over the plural light emitting diode packages in a cross-sectional view. The time represented by the optical characteristics in FIGS. 6A and 6B may correspond to the third time ET-S shown in FIG. 5B.

Hereinafter, FIGS. 6A and 6B will be referenced to explain effects arising from one or more exemplary embodiments of the light emitting diode package 100 according to the invention. The elements same as those shown in FIGS. 1 to 5 will be indicated by the same reference numerals, but will not be further described in detail. Regions AA' indicated in FIGS. 6A and 6B are corresponding regions of the light source modules described above.

As shown in FIG. 6A, the light source module adopting a comparative model of the light emitting diode package EX as a light source may be seen as reddish (relatively darker areas within region AA') even after external power is completely shut down at the third time ET-S. The second light L2 (see FIG. 4A) may not be absorbed into the body member 120-E (see FIG. 4A) but instead remains in the inner cavity to cause an afterglow effect. Accordingly, due to the afterglow effect, the light source module adopting a comparative model of the light emitting diode package EX as a light source has a defect in that a reddish effect is visibly recognized at a position external thereto.

In contrast, as shown in FIG. 6B, a light source module adopting an exemplary embodiment of the light emitting diode package 100 as a light source may be seen having less of a reddish effect as compared to that of the light source module which adopts the comparative model of the light emitting diode package EX as a light source. Since one or more exemplary embodiments of the light emitting diode package 100 includes the body member 120 (see FIG. 4B) which absorbs a portion of the second light L2 (see FIG. 4B), the light emitting diode package 100 effectively reduces the afterglow effect generated by the second light L2.

One or more exemplary embodiments of the light emitting diode package 100 according to the invention may contribute to reducing an afterglow effect, improving a drivability thereof. Therefore, according to one or more exemplary embodiments of the invention, an improved light emitting diode package is provided for which driving turn-on/turn-off operations thereof are relatively easy, and for which color reproducibility thereof is improved as compared to that of a light emitting diode package which has nitride-based phosphors. In an exemplary embodiment, the light emitting diode package 100 may be simply applicable to any or a number of display devices, such as within a three-dimensional ("3D") display panel which requires high-speed drivability.

Figure 7A:
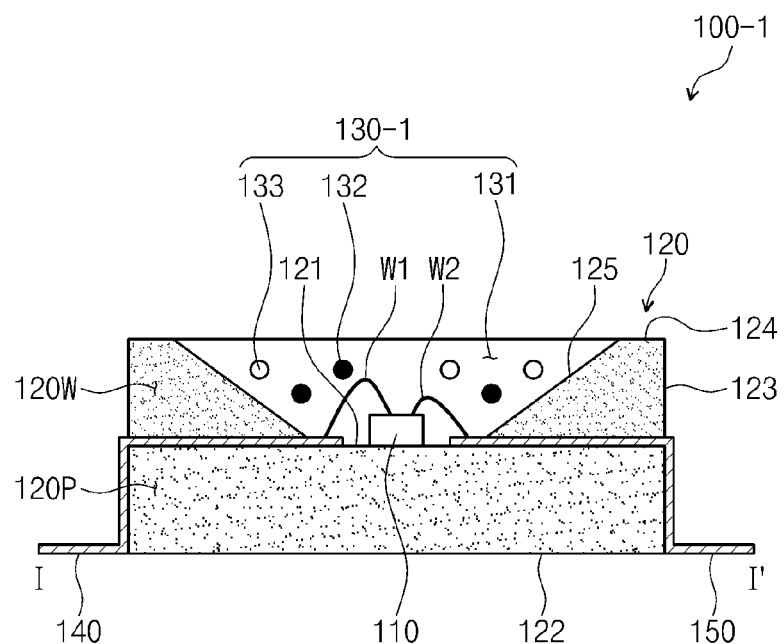
FIG. 7A is a sectional view illustrating another exemplary embodiment of a light emitting diode package taken along I-I' of FIG. 1 according to the invention.
Figure 7B:
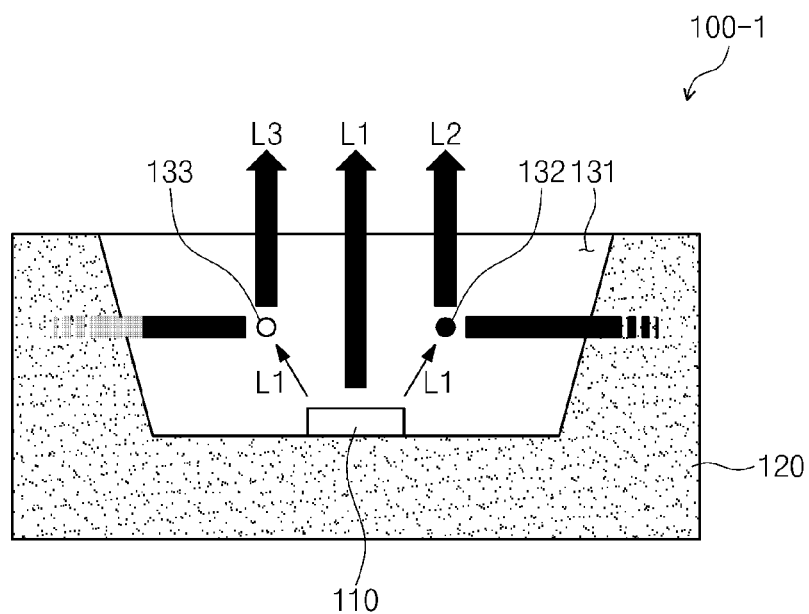
FIG. 7B is a sectional view schematically illustrating light paths in the light emitting diode package shown in FIG. 7A.

FIG. 7A is a sectional view illustrating another exemplary embodiment of a light emitting diode package taken along I-I' of FIG. 1 according to the invention. FIG. 7B is a sectional view schematically illustrating light paths in the light emitting diode package shown in FIG. 7A.

Hereinafter, FIGS. 7A and 7B will be referred to describe a light emitting diode package 100-1 according to another exemplary embodiment of the invention. The elements same as those illustrated in FIGS. 1 to 6B will be indicated by the same reference numerals without additional descriptions.

As shown in FIGS. 7A and 7B, a filling member 130-1 may further include a plurality of second phosphors 133 in addition to the plurality of first phosphors 132. The second phosphors 133 may absorbs at least a portion of a first light L1 to generate a third light L3 having a fourth color which is different from the first color of the first light L1.

In the exemplary embodiment shown in FIGS. 7A and 7B, when the first light L1 is blue light with a wavelength of about 500 nm which is larger than about 450 nm, and the second light L2 is red light with a wavelength of about 780 nm which is larger than about 620 nm, the third light L3 may be green light with a wavelength of about 570 nm which is larger than about 500 nm.

Pluralities of first phosphors 132 and second phosphors 133 may each be excited by a first light L1 which is generated from the light emitting diode 110, to respectively generate the second light L2 of red color and the third light L3 of green color. The second light L2 and the third light L3 may be mixed to form a white light. Accordingly, one or more exemplary embodiments of the light emitting diode package 100-1 according to the invention may output a white light outward therefrom.

The body member 120 of the light emitting diode package 100-1 according to the invention may include or have the third color which absorbs the second light L2. Since the third color absorbs the second light L2 of red color, an afterglow effect by the second light L2 of red color is reduced, and as the afterglow effect is reduced, the light emitting diode package 100-1 may generate a white colored light with high purity to achieve improved color reproducibility thereof as compared to that of a light emitting diode package which has nitride-based phosphors.

As described above, the body member 120 may include or have a color capable of absorbing a portion of the second light L2 incident thereto. When the third light L3 is relatively high in afterglow characteristics, the body member 120 may include or have a color capable of absorbing a portion of the third light L3 incident thereto to balance visibility of the first light L1, the second light L2 and the third light L3. The light emitting diode package 100-1 may lessen the afterglow effect therefrom and improve color reproducibility by modifying a color of the body member 120 to include one or more colors which are capable of absorbing respective color lights.

While the invention has been described with reference to exemplary embodiments, it will be apparent to those skilled in the art that various changes and modifications may be made without departing from the spirit and scope of the invention set forth throughout the claims. Therefore, it should be understood that the above exemplary embodiments are not limiting, but illustrative, hence all technical features within the claims and the equivalents thereof may be construed as properly belonging to an overall scope of the invention.

What is claimed is:

1. A light emitting diode package comprising:
   a light emitting diode which generates and emits a first light having a first color;
   a body member defining:
   a planar part thereof on which the light emitting diode is mounted, and
   a side part thereof which is extended upward from the planar part,
   wherein the planar part and the side part define an inner cavity of the light emitting diode package in which the light emitting diode is disposed; and
   a filling member comprising:
   a base part filled in the inner cavity,
   a plurality of first phosphors randomly dispersed in the base part, the first phosphors absorbing a first portion of the first light emitted by the light emitting diode and generating a second light having a second color different from the first color, and
   a plurality of second phosphors randomly dispersed in the base part, the second phosphors absorbing a second portion of the first light emitted by the light emitting diode and generating a third light having a third color different from the first color and the second color,
   wherein the first phosphors and the second phosphors are disposed on the light emitting diode and interposed between the side part and the light emitting diode in a cross-sectional view,
   wherein
   the body member comprises a fourth color different from the second color and the third color, the fourth color absorbing the second color to prevent the body member from changing to the second color.

2. The light emitting diode package according to claim 1, wherein the fourth color is one of blue, cyan and black.

3. The light emitting diode package according to claim 2, wherein the second color is red.

4. The light emitting diode package according to claim 3, wherein the first phosphors comprise a fluorinated material.

5. The light emitting diode package according to claim 3, wherein the first color is blue.

6. The light emitting diode package according to claim 3, wherein the third color is green.

7. The light emitting diode package according to claim 2, wherein the body member comprises:
   a matrix material part; and
   a plurality of pigment particles dispersed in the matrix material part and having the fourth color.

8. The light emitting diode package according to claim 7, wherein the matrix material part comprises a resinous material or silicon.

9. The light emitting diode package according to claim 7, wherein a content of the pigment particles within the body member is larger at first portions of the body member adjacent to the inner cavity than at second portions of the body member further from the inner cavity than the first portions thereof.

10. The light emitting diode package according to claim 1, wherein the base part of the filling member which fills the inner cavity comprises a resinous material or silicon.

11. The light emitting diode package according to claim 1, further comprising:
    a first lead fixed to the body member and through which a first voltage is provided to the light emitting diode; and
    a second lead which is fixed to the body member to be insulated from the first lead and through which a second voltage lower than the first voltage is provided to the light emitting diode to which the first voltage is provided.

12. The light emitting diode package according to claim 1, wherein the fourth color prevents the color of the body member from changing to the second color by eliminating the second color of a light incident to the body member from the filing member.

13. The light emitting diode package according to claim 1, wherein the planar part and the side part have same colors to each other.

14. A light emitting diode package comprising:
    a light emitting diode which generates and emits a first light having a first color;
    a body member defining:
    a planar part thereof on which the light emitting diode is mounted, and
    a side part thereof which is extended upward from the planar part,
    wherein the planar part and the side part define an inner cavity of the light emitting diode package in which the light emitting diode is disposed; and
    a filling member comprising a base part filled in the inner cavity, and a plurality of first phosphors which is dispersed in the base part, the first phosphors absorbing at least a portion of the first light emitted by the light emitting diode and generating a second light having a second color different from the first color,
    wherein
    the body member comprises a third color different from the second color, and
    the second light having the second color generated in the filling member is absorbed by the body member, such absorbed second light having the second color remains in the body member as the second light having the second color.

15. The light emitting diode package according to claim 14, wherein a wavelength range of the third color of the body member overlaps a wavelength range of the second color of the second light.

* * * * *